United States Patent
Pan et al.

(10) Patent No.: US 7,327,629 B2
(45) Date of Patent: Feb. 5, 2008

(54) CIRCUIT AND METHOD FOR READING AN ANTIFUSE

(75) Inventors: Dong Pan, Boise, ID (US); Abhay Dixit, San Diego, CA (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 11/509,955

(22) Filed: Aug. 25, 2006

(65) Prior Publication Data

US 2006/0285416 A1    Dec. 21, 2006

Related U.S. Application Data

(62) Division of application No. 11/054,645, filed on Feb. 8, 2005, now Pat. No. 7,190,629.

(51) Int. Cl.
*G11C 17/18* (2006.01)
(52) U.S. Cl. ............... 365/225.7; 365/222; 365/96; 327/525; 327/526; 257/50
(58) Field of Classification Search ........... 365/225.7, 365/222, 96; 327/525, 526; 257/50
See application file for complete search history.

(56) References Cited

U.S. PATENT DOCUMENTS

| | | | |
|---|---|---|---|
| 5,345,110 A | 9/1994 | Renfro et al. ............. 307/272.3 |
| 5,514,980 A | 5/1996 | Pilling et al. .................. 326/38 |
| 5,583,463 A | 12/1996 | Merritt ........................ 327/526 |
| 5,619,469 A | 4/1997 | Joo ........................... 365/225.7 |
| 5,631,862 A | 5/1997 | Cutter et al. .................. 365/96 |
| 5,684,732 A * | 11/1997 | Sako ............................ 365/96 |
| 5,831,923 A | 11/1998 | Casper ..................... 365/225.7 |
| 5,923,672 A | 7/1999 | Roberts et al. ............. 371/10.2 |
| 5,956,282 A | 9/1999 | Casper ..................... 365/225.7 |
| 5,978,297 A | 11/1999 | Ingalls ..................... 365/225.7 |
| 6,087,890 A | 7/2000 | Kim ........................... 327/526 |
| 6,266,291 B1 | 7/2001 | Sher et al. .................. 365/226 |
| 6,351,425 B1 | 2/2002 | Porter ..................... 365/225.7 |
| 6,384,666 B1 | 5/2002 | Bertin et al. ................ 327/525 |
| 6,430,101 B1 | 8/2002 | Toda ....................... 365/225.7 |
| 6,882,202 B2 | 4/2005 | Lehman et al. ............. 327/208 |
| 6,937,495 B2 | 8/2005 | Scheuerlein ................. 365/105 |
| 2003/0021148 A1* | 1/2003 | Scheuerlein ................. 365/175 |
| 2003/0026120 A1* | 2/2003 | Scheuerlein ................. 365/105 |
| 2003/0174568 A1 | 9/2003 | Blodgett ................... 365/225.7 |
| 2004/0151048 A1 | 8/2004 | Cho ........................ 365/225.7 |
| 2004/0174204 A1 | 9/2004 | Tsujino et al. ............. 327/526 |
| 2006/0244099 A1* | 11/2006 | Kurjanowicz ............... 257/530 |

* cited by examiner

*Primary Examiner*—Richard T. Elms
*Assistant Examiner*—Eric Wendler
(74) *Attorney, Agent, or Firm*—Dorsey & Whitney LLP

(57) ABSTRACT

An antifuse circuit and antifuse reading method for determining whether an antifuse is programmed or un-programmed. An antifuse circuit includes a sensing circuit having a sense node coupled to the antifuse that is configured to generate a reference current and compare a sense current at the sense node relative to the reference current. The sensing circuit generates an output signal having a first logic level in response to the sense current being greater than the reference current and generates the output signal having a second logic level in response to the sense current being less than the reference current. The logic level of the output signal indicative of whether the antifuse is programmed or un-programmed.

8 Claims, 6 Drawing Sheets

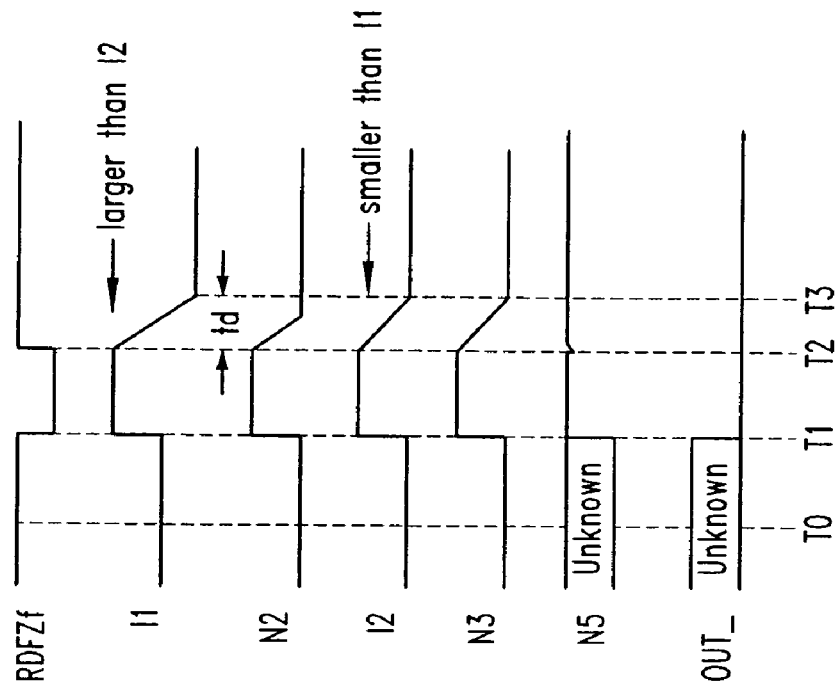
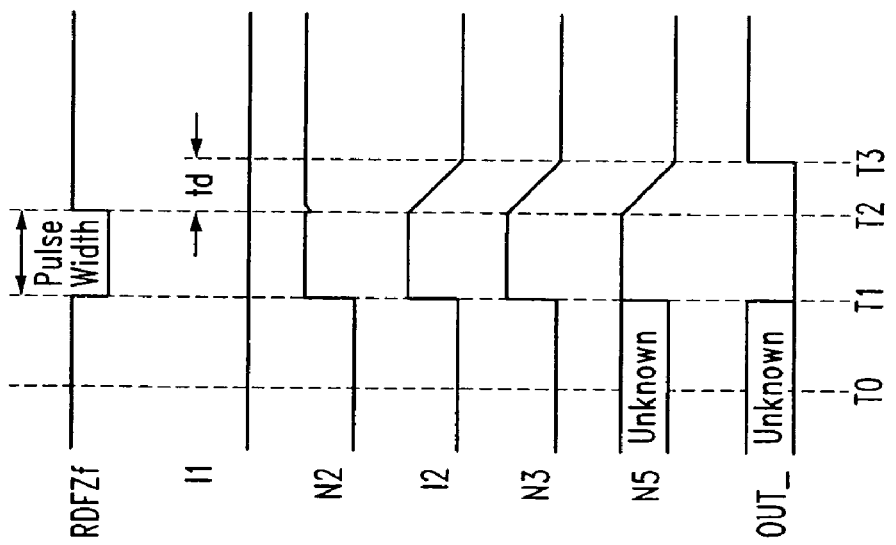
Fig. 4A
Fig. 4B

CIRCUIT AND METHOD FOR READING AN ANTIFUSE

CROSS-REFERENCE TO RELATED APPLICATION

This application is a divisional of U.S. patent application Ser. No. 11/054,645, filed Feb. 8, 2005 now U.S. Pat. No. 7,190,629.

TECHNICAL FIELD

The invention relates generally to semiconductor antifuse circuits, and more specifically, to a circuit and method for reading the programmed or un-programmed state of an antifuse circuit that is insensitive to the pulse width of a signal initiating an antifuse read operation.

BACKGROUND OF THE INVENTION

Antifuses are used in a variety of semiconductor circuits for permanently programming digital information. For example, antifuses are often used in semiconductor memory devices, such as synchronous dynamic random access memory (SDRAM), to program the memory addresses of defective memory locations that are remapped to redundant memory locations. Antifuses are also used to permanently set various memory device options or program device information, such as speed grade, data width, and the like. Conventional antifuses are capacitive structures that, in their un-programmed states, form open circuits, and in their programmed states, form short circuits or low resistance circuits. An antifuse may be blown by applying a relatively high-voltage across its two terminals, which causes a dielectric layer disposed between the two terminals to break down, and thus, form a conductive path between the two terminals of the antifuse. Based on the conductivity of the antifuse, a circuit coupled to the antifuse, referred to as an antifuse circuit or an antifuse reading circuit, generates a signal having a logic level that is indicative of the programmed or un-programmed state of the antifuse.

FIG. 1 illustrates a conventional antifuse reading circuit 100 for reading the state of an antifuse 102. The antifuse 102 can be modeled as a capacitor 103 coupled in parallel with a resistance 104 and a switch 105, which are coupled in series. The capacitor 103 with the switch 105 open represents the capacitance of the antifuse 102 in an un-programmed state while the resistance 104 and the switch 105 closed represent the antifuse 102 in a programmed state.

The antifuse 102 has a first node coupled to ground and a second node coupled to a node N1 through an n-channel metal oxide semiconductor (NMOS) transistor 108 having a gate coupled to a pumped voltage VCCP. The VCCP voltage applied to the gate keeps the transistor 108 ON. The node N1 is coupled to an NMOS transistor 110 having a gate coupled to ground. Coupling the gate of the transistor 110 to ground keeps the transistor 110 OFF. The node N1 is coupled to an antifuse state latch 120 through an NMOS transistor 112. A gate of the transistor 112 is coupled to a voltage supply providing a voltage approximately one-half of VCC to keep the transistor 112 in a conductive/resistive state. The transistors 108, 110, and 112 can be used for programming an antifuse, as known in the art. However, as shown in FIG. 1, the antifuse reading circuit 100 is configured for reading the antifuse 102 in response to an active LOW antifuse read signal RDFZf.

The antifuse state latch 120 latches the state of the antifuse 102 in response to the RDFZf signal being pulsed LOW. The antifuse latch 120 includes an activation inverter shown as a p-channel metal oxide semiconductor (PMOS) transistor 130 and an NMOS transistor 134, a first inverter shown as inverter 136, and a second inverter shown as a PMOS transistor 140 and NMOS transistor 148. A latch is formed by the PMOS transistor 140, which is coupled in parallel with the transistor 130, and the NMOS transistor 148, which are both coupled to an output of the inverter 136. A PMOS transistor 144 having a gate coupled to ground provides a voltage VCC for the antifuse latch 120. The PMOS transistor 144 is generally a "long" transistor to provide sufficient current to trigger the antifuse latch 120 during an antifuse read operation when the RDFZf signal is pulsed LOW.

Operation of the antifuse reading circuit 100 will be described with respect to a signal timing diagram illustrated in FIG. 2. The timing diagram generally illustrates a voltage level at a node N2 (FIG. 1) corresponding to an input of the inverter 136 and a voltage level of an output signal OUT provided at the output of the inverter 136 in response to an antifuse read operation initiated by a RDFZf signal 200 being pulsed LOW. The OUT signal has a voltage level that is indicative of the state of the antifuse 102. The N2 signal 202 and the OUT signal 204 correspond to the case when an un-programmed antifuse is read and the N2 signal 206 and the OUT signal 208 correspond to the case when a programmed antifuse is read. At a time T0, prior to the antifuse read operation, the RDFZf signal 200 is HIGH and the OUT signal is HIGH as well. As a result, the transistors 134 and 148 are ON to couple the node N2 to ground, and the transistors 120 and 130 are OFF to isolate the node N2 from the VCC voltage supply. At a time T1, the RDFZf signal is pulsed LOW to initiate the antifuse read operation. In response to the LOW RDFZf signal, the transistor 134 is switched OFF. The transistor 130 is also switched ON to decouple the node N2 from ground and couple the node N2 to the VCC voltage supply, respectively. The OUT signal at this time remains HIGH since the voltage at the node N2 is still less than a voltage trigger level of the inverter 136, at which, the inverter 136 will invert the OUT signal.

In the case where the antifuse 102 is un-programmed, the voltage at the node N2 begins to increase due to the coupling of the VCC voltage supply through the transistor 130. As previously discussed, the un-programmed antifuse 102 can be modeled as the capacitor 103. Thus, the voltage at the node N2 will require a finite time to increase to a voltage level sufficient to cause the inverter 136 to invert the OUT signal. At a time T2, the increasing voltage level of the node N2 is greater than the voltage trigger level of the inverter 136, causing it to invert the OUT signal from HIGH to LOW indicating that the antifuse 102 is un-programmed. The LOW OUT signal switches OFF the transistor 148 and switches ON the transistor 140. As a result, the node N2 is now coupled to the VCC voltage supply through both transistors 130 and 140, and the voltage level of the node N2 increases at a faster rate. The activation of the transistor 140 causes the LOW OUT signal to be latched by coupling the node N2 to the VCC voltage supply. By a time T3, the node N2 is charged to its maximum voltage level, and at a time T4, the RDFZf signal returns HIGH to complete the antifuse read operation by switching the transistor 130 OFF and switching the transistor 134 ON. The LOW OUT signal continues to be latched by the inverter 136 and the transistor 140.

With reference to the N2 signal 206 and the OUT signal 208, in the case where the antifuse 102 is programmed, the voltage level at the node N2 does not increase at the time T1, or increases slightly due to the antifuse 102 being modeled as the resistance 104. That is, when the transistor 130 is switched ON in response to the RDFZf signal being pulsed LOW, the VCC voltage supply is coupled through the transistors 112 and 108, and the programmed antifuse 102 to ground. As a result, the voltage level at the node N2 is never sufficient to cause the inverter 136 to invert the OUT signal, and the OUT signal is maintained LOW at the completion of the antifuse read operation, thus, indicating that the antifuse 102 is programmed.

As illustrated by the previous discussion, the pulse width of the LOW pulse of the RDFZf signal should be sufficient to allow the voltage level of the node N2 to increase to above the voltage trigger level of the inverter 136 in order to accurately read the state of the antifuse 102. Typically, at least 15 nanoseconds (ns) are required to accurately read the state of the antifuse 102 using the conventional antifuse reading circuit 100. If the duration, or "pulse width" of the LOW pulse of the RDFZf signal is not sufficient, an un-programmed antifuse may be incorrectly read as a programmed antifuse. IN order to avoid misreading the state of the antifuse 102, a worst case is assumed and the pulse width of the LOW pulse of the RDFZf signal is typically 30 ns to provide adequate margin.

Under some power, voltage and temperature conditions, however, the pulse width can be as short as 13 ns, less than what is generally required for accurate reading of an antifuse. Moreover, different temperature conditions can also affect the amount of time needed to charge the antifuses due to changes in leakage and junction capacitances. Varying voltage supply levels also influence the amount of time required to charge the antifuse 102. Additionally, physical characteristics of the antifuse 102 and transistors of the antifuse reading circuit may vary substantially between memory devices. For example, the antifuse 102 of one memory device may have substantially greater capacitance than the antifuse 102 in another memory device requiring greater time for the antifuse reading circuit to accurately read the state of an antifuse. Similarly, the transistors in one memory device may offer substantially different resistance to current than the transistors in another memory device due to inherent variations in the processing of large numbers of semiconductor chips. The pulse width of the LOW pulse of the RDFZf signal can be increased to accommodate the various influences to ensure accurate reading of the antifuse state under worst case conditions. However, increasing the pulse width of the LOW pulse of the RDFZf signal will negatively impact power-up performance of the memory device and its operating speed, as well as increase initial power consumption by the memory device.

Therefore, there is a need for an alternative circuit and method for accurately reading the state of an antifuse that is less dependent on the pulse width of a signal initiating an antifuse read operation.

SUMMARY OF THE INVENTION

The present invention is related to an antifuse circuit and method for determining whether an antifuse is programmed or un-programmed. In one aspect of the invention the antifuse circuit includes a sensing circuit having a sense node coupled to the antifuse that is configured to generate a reference current and compare a sense current at the sense node relative to the reference current. The sensing circuit generates an output signal having a first logic level in response to the sense current being greater than the reference current and generates the output signal having a second logic level in response to the sense current being less than the reference current. The logic level of the output signal is indicative of whether the anti fuse is programmed or un-programmed.

In another aspect of the invention, a method for reading an antifuse includes generating a reference current and comparing a sense current having a magnitude based on the impedance of the antifuse to the reference current. An output signal having a logic level representative of a programmed state of the antifuse is generated in response to the sense current being greater than the reference current and an output signal having a logic level representative of an un-programmed state of the antifuse is generated in response to the sense current being less than the reference current.

In another aspect of the invention, a method for determining whether an antifuse is programmed or un-programmed includes initializing a reference node and a sense node to an initialization voltage. The sense node is coupled to the antifuse. A reference current is generated in response to the initialization voltage and a sense current is generated in response to the initialization voltage. The sense current has a magnitude based on the impedance of the antifuse. The sense current and the reference current are compared, and in response to the sense current being greater than the reference current, a first logic level is latched. Conversely, a second logic level is latched in response to the sense current being less than the reference current. An output signal having a logic level indicative of the programmed or un-programmed state of the antifuse is generated based on the latched logic level.

BRIEF DESCRIPTION OF THE DRAWINGS

FIG. 4 is a timing diagram of various signals during the operation of the antifuse reading circuit shown in FIG. 3.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
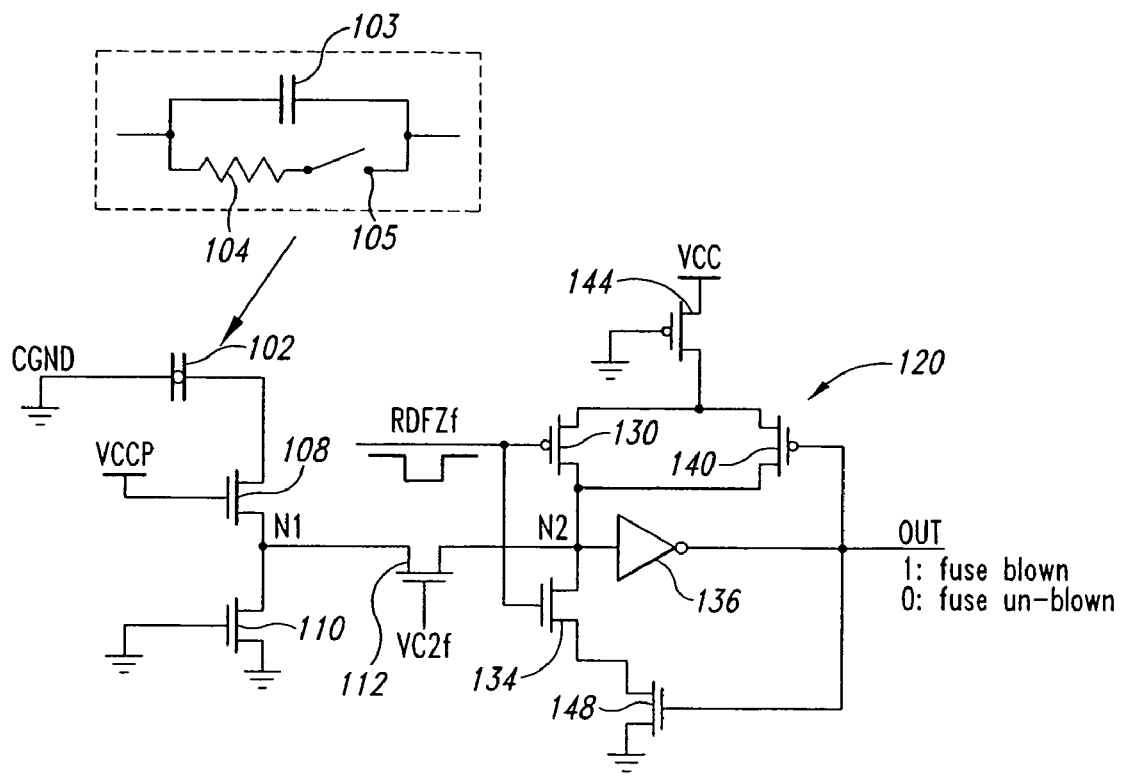
FIG. 1 is a schematic diagram of a conventional antifuse reading circuit.
Figure 2:
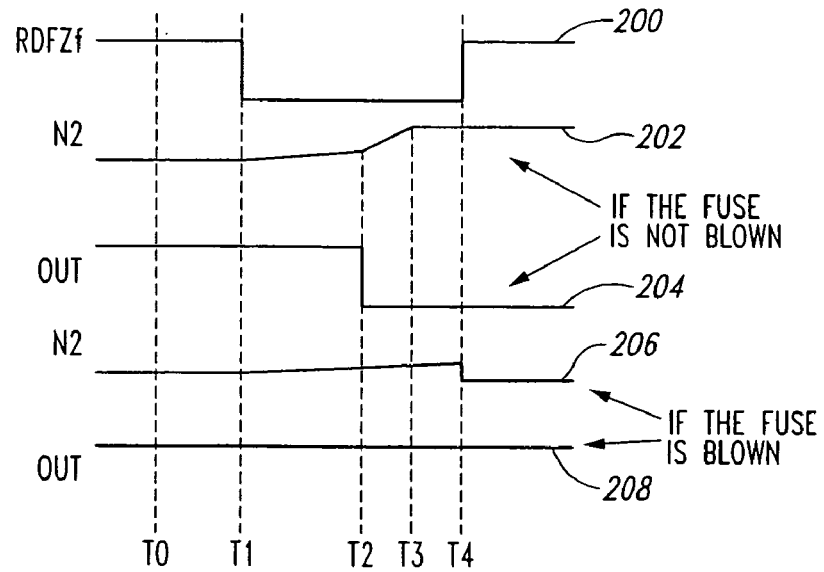
FIG. 2 is a timing diagram of various signals during the operation of the antifuse reading circuit shown in FIG. 1.
Figure 3:
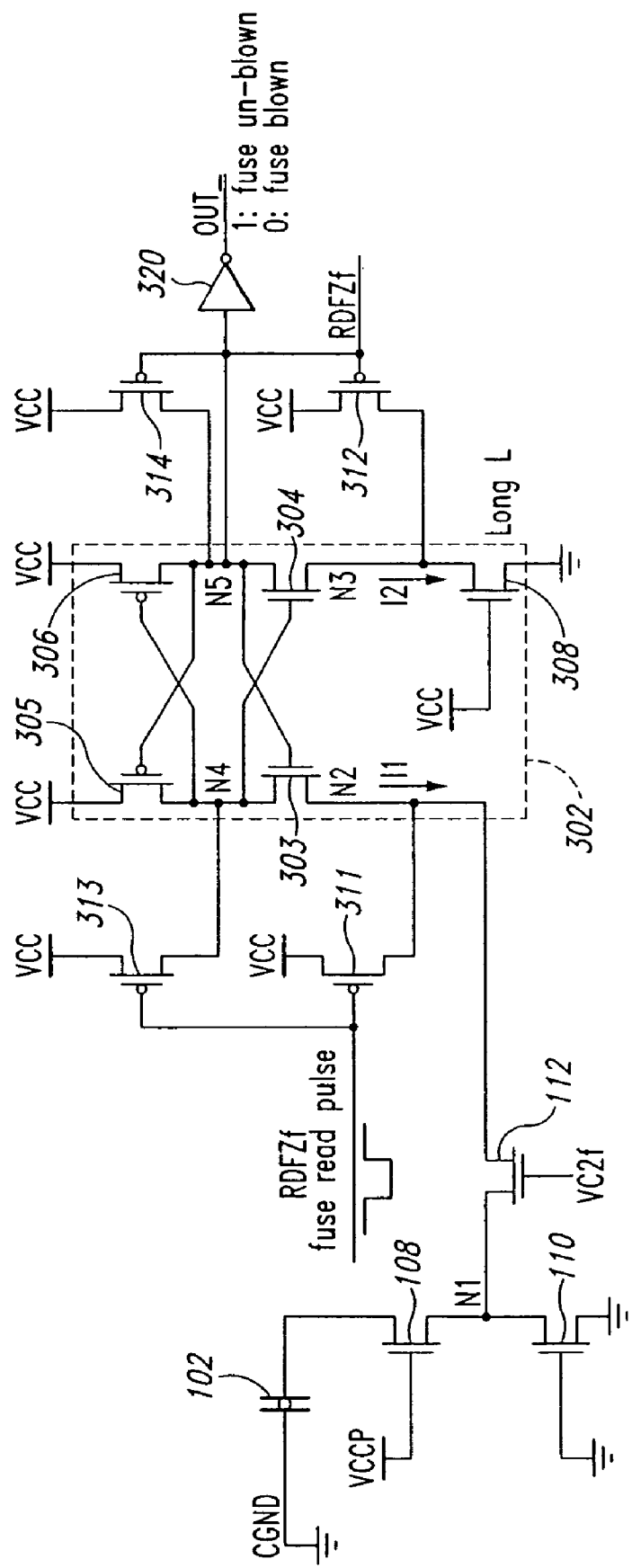
FIG. 3 is a schematic diagram of an antifuse reading circuit according to an embodiment of the present invention.

FIG. 3 illustrates an antifuse reading circuit 300 according to an embodiment of the present invention. Some elements shown in FIG. 3 have been previously described with respect to the antifuse reading circuit 100 shown in FIG. 1. Namely, the antifuse 102, the node N1, and transistors 108, 110, and 112. These elements will not be described again in the interest of brevity. The antifuse reading circuit 300 includes a sense latch 302 having a sense node N2 that is coupled to the transistor 112. NMOS transistors 303, 304 and PMOS transistors 305, 306 are arranged as cross-coupled complementary metal oxide semiconductor (CMOS) inverters to form a latch. An NMOS transistor 308 is coupled to a sense node N3 and, as will be explained in more detail below, establishes a reference current I2. The antifuse reading circuit 300 further including four PMOS transistors 311-314. Each transistor 311-314 is coupled to a respective node N2, N3, N4, and N5 of the sense latch 302 and a VCC voltage supply. The transistors 311-314 each have a gate at which an antifuse read signal RDFZf is applied. In response to a LOW pulse of the RDFZf signal, each transistor 311-314 couples the respective node N2-N5 to the VCC voltage supply. An inverter 320 having an input coupled to the node N5 provides an OUT_ signal having a logic level indicative of the state of the antifuse 102. The underscore "_" following "OUT" designates that the OUT_ signal is active LOW. That is, the logic level of the OUT signal corresponds to the inverse state of the antifuse compared to the antifuse read circuit 100 of FIG. 1. More specifically, as shown in FIG. 3, an OUT_ signal having a HIGH logic level indicates an un-programmed antifuse 102 and an OUT_ signal having a LOW logic level indicates a programmed antifuse 102. The inverter 320 can be coupled to the node N4 if the inverse logic state is desired.

Operation of the antifuse reading circuit 300 will be described with respect to FIGS. 4A and 4B. FIG. 4A illustrates various signals during the operation of the antifuse reading circuit 300 when the antifuse 102 is un-programmed. FIG. 4B illustrates various signals during the operation of the antifuse reading circuit 300 when the antifuse 102 is programmed.

With respect to FIG. 4A, at a time T0, prior to the initiation of an antifuse read operation, the RDFZf signal is HIGH, which keeps the transistors 311-314 OFF and the respective nodes N2-N5 decoupled from the VCC voltage supply. Also at the time T0, the node N5 is at an unknown state, which results in the OUT_ signal having an unknown state as well. At a time T1, the RDFZf signal goes LOW to initiate an antifuse read operation. The transistors 311-314 are switched ON, coupling the nodes N2-N5, respectively, to the VCC voltage supply. As a result, the OUT_ signal is LOW due to the VCC voltage coupled to the node N5, and the transistors 303-306 are OFF since the respective gate-source voltages (Vgs) do not exceed the respective transistor threshold voltages (Vt). A reference current I2 results from coupling the VCC voltage to the node N3. The value of the I2 current is established based on the impedance of the transistor 308. As previously mentioned, FIG. 4A represents the condition where the antifuse 102 is un-programmed. As a result, a sense current I1, that has a magnitude dependent on the state of the antifuse 102, is zero, or nearly zero due to leakage currents.

At a time T2, the RDFZf signal returns HIGH, decoupling the nodes N2-N5 from the VCC voltage supply. Both transistors 303 and 304 remain OFF immediately after the nodes N4 and N5 are decoupled from the VCC voltage supply because the respective gate-source voltages (Vgs) still do not exceed the respective threshold voltages (Vt) of the transistors 303 and 304. However, the Vgs of the transistor 304 is increasing due to the reference current I2 discharging the node N3. In contrast, the Vgs of the transistor 303 remains approximately the same because the sense current I1 is zero due to the un-programmed state of the antifuse 102. As the I2 current continues to decrease the voltage level of the node N3, the Vgs of the transistor 304 eventually exceeds its Vt, causing the transistor 304 to switch ON. The node N5 is now coupled to the node N3 through the transistor 304, which switches ON the transistor 305, and keeps the transistor 303 OFF. The node N4 is now coupled through the transistor 305 to the VCC voltage supply to keep the transistor 306 OFF and ensure that the transistor 304 is fully ON. By a time T3, the voltage levels of the nodes N3 and N5 are at ground and the sense latch 302 is set. As a result, the inverter 320 generates an OUT_ signal having a HIGH logic level indicating that the antifuse 102 is un-programmed. The OUT_ signal can be sampled at any time after the time T3 to determine that the antifuse 102 is un-programmed.

With respect to FIG. 4B, that is, the case where the antifuse 102 is programmed, at a time T0 the RDFZf signal is HIGH and the condition of the transistors 303-306 and 311-314 is the same as previously described with respect to FIG. 4A. As a result, the logic level of the OUT_ signal is unknown. At a time T1, the RDFZf signal goes LOW, initiating the antifuse read operation. The transistors 311-314 are switched ON, and the respective nodes N2-N5 are coupled to the VCC voltage supply. With the node N5 coupled to the VCC voltage supply, the inverter 320 generates an OUT_ signal having a LOW logic level. In contrast to FIG. 4A, a sense current I1 having a non-zero magnitude results from the coupling of the node N2 to the VCC voltage supply. The current I1 is present due to the programmed state of the antifuse 102.

At a time T2, the RDFZf signal returns HIGH, switching OFF the transistors 311-314 to decouple the respective nodes N2-N5 from the VCC voltage supply. As previously described with respect to FIG. 4A, immediately after the nodes N2-N5 are decoupled from the VCC voltage supply, the transistors 303-306 are OFF since the respective Vgs is less than the Vt of the respective transistors. However, unlike the case where the antifuse 102 is un-programmed, the magnitude of the I1 current is greater than the magnitude of the I2 current where the antifuse 102 is programmed. As a result, the voltage level of the node N2 decreases faster than the voltage level of the node N3, which causes the Vgs of the transistor 303 to exceed its Vt before the Vgs of the transistor 304 exceeds its Vt. The transistor 303 switches ON to couple the node N4 to the node N2, which in turn switches ON the transistor 306 and prevents the transistor 304 from switching ON. The node N5 is now coupled to the VCC voltage supply maintaining the transistor 305 in an OFF state and fully switching the transistor 303 ON. By a time T3, the node N5 is fully coupled to the VCC voltage supply and the sense latch 302 is set. The inverter 320 generates an OUT_ signal having a LOW logic level indicating that the antifuse 102 is programmed. The OUT_ signal can be sampled at any time after the time T3 to determine that the antifuse 102 is programmed.

As illustrated by the previous discussion, the antifuse reading circuit 300 generates an OUT_ signal having a logic level indicative of the programmed or un-programmed state of the antifuse 102 based on the magnitude of the sense current I1 relative to the reference current I2. The magnitude of the reference current I2 is based on the transistor 308, which can be designed with a dimension that sets the I2 current to a suitable reference magnitude. As a result, the sensing portion of the antifuse read operation is independent of the pulse width of the LOW pulse of the RDFZf signal and takes place between the times T2 and T3 after the RDFZf signal returns HIGH. In the antifuse reading circuit 300, the pulse width of the LOW pulse of the RDFZf signal needs to long enough to allow the nodes N2-N5 to be coupled to the VCC voltage supply and for the voltage levels of the respective nodes to be pulled to VCC. In contrast, the pulse width for the conventional antifuse reading circuit 100 must be of sufficient duration to allow the voltage level of a sense node to exceed a trigger point of an inverter. The time for an antifuse to be read by the antifuse reading circuit 300 is the sum of the pulse width of the LOW pulse (i.e., from the time T1 to T2) of the RDFZf signal, and the time for the sense latch 302 to latch the state of the antifuse 102 and the inverter 320 to generate an OUT_ signal in response to the latching (i.e., from the time T2 to T3). Depending on the particular dimensions of the transistors of the antifuse reading circuit 300, the total time for reading an antifuse can be as short as 5 ns.

Figure 5:
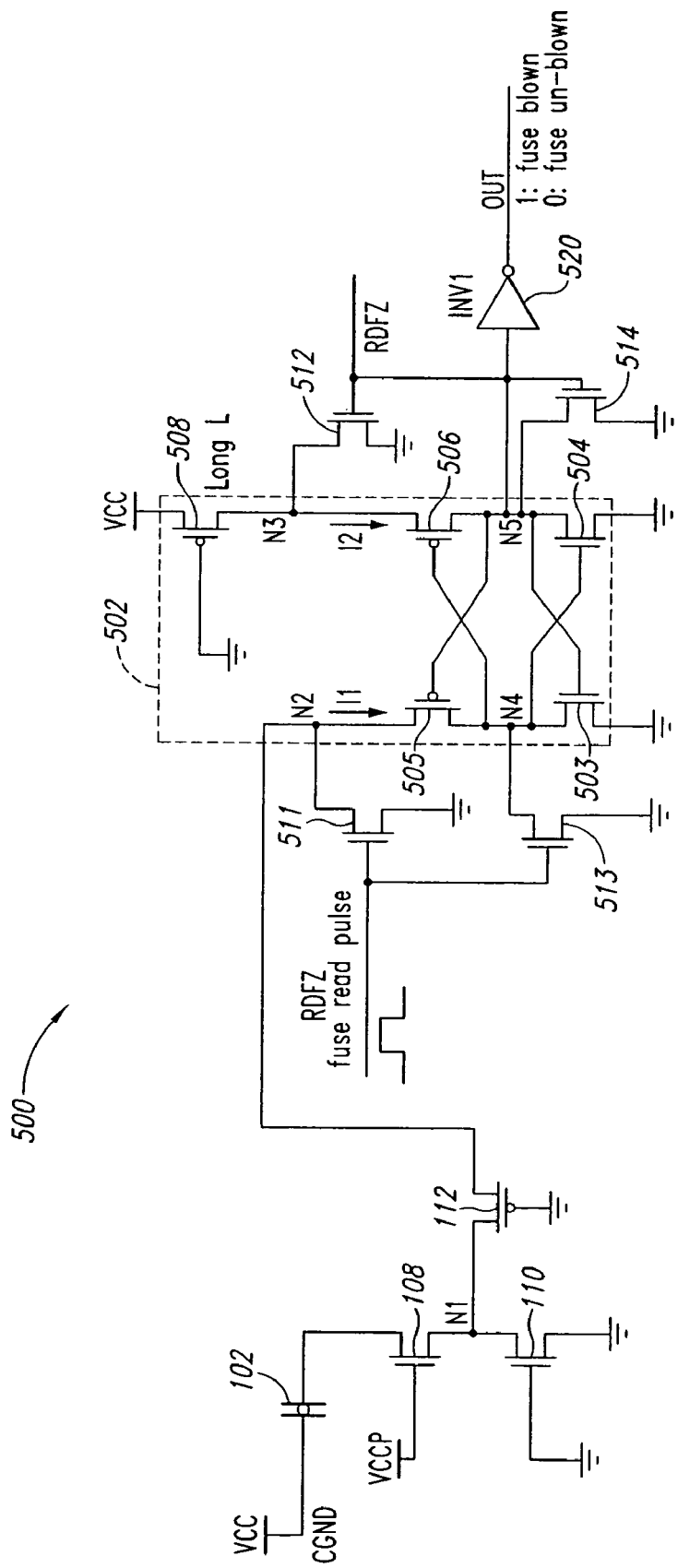
FIG. 5 is a schematic diagram of an antifuse reading circuit according to alternative embodiment of the present invention.

FIG. 5 illustrates an antifuse reading circuit 500 according to an alternative embodiment of the present invention. Some elements shown in FIG. 5 have been previously described with respect to the antifuse reading circuit 100 shown in FIG. 1. Namely, the antifuse 102, the node N1, and transistors 108, 110, and 112. These elements will not be described again in the interest of brevity. In contrast to FIG. 1, however, the antifuse 102 is coupled to a VCC voltage supply and the transistor 112 is coupled to ground representing the operating condition during an antifuse read operation. The antifuse reading circuit 500 includes a sense latch 502 having a sense node N2 that is coupled to the transistor 112. NMOS transistors 503, 504 and PMOS transistors 505, 506 are arranged as cross-coupled CMOS inverters to form a latch. PMOS transistor 508 is coupled to a sense node N3 and, as will be explained in more detail below, establishes a reference current I2. The antifuse reading circuit 500 employs a PMOS transistor 508 for setting the magnitude of the reference current I2, in contrast to the antifuse reading circuit 300, which uses an NMOS transistor 308. To provide similar resistive switch points for the antifuse reading circuits 300 and 500, the PMOS transistor 508 can have smaller dimensions relative to the NMOS transistor 308. The antifuse reading circuit 500 further including four NMOS transistors 511-514. Each transistor 511-514 is coupled to a respective node N2, N3, N4, and N5, respectively, of the sense latch 502 and ground. The transistors 511-514 each have a gate at which an antifuse read signal RDFZ is applied to couple the respective nodes N2-N5 to ground in response to a HIGH pulse of the RDFZ signal. An inverter 520 having an input coupled to the node N5 provides an OUT signal having a logic level indicative of the state of the antifuse 102. As shown in FIG. 5, an OUT signal having a LOW logic level indicates an un-programmed antifuse 102 and an OUT signal having a HIGH logic level indicates a programmed antifuse 102.

Operation of the antifuse reading circuit 500 is similar to that of the antifuse reading circuit 300 in that a sense current I1, which has a magnitude based on the state of the antifuse 102, is compared to the reference current I2 for reading the state of the antifuse 102. That is, if the magnitude of the sense current I1 is less than the magnitude of the reference current I2, the transistor 506 will become conductive before the transistor 505, causing the node N4 to be pulled to ground through the transistor 503 and the node N5 to develop a sufficient voltage level to cause the inverter 520 to generate an OUT signal having a LOW logic level indicating that the antifuse 102 is un-programmed. Conversely, if the magnitude of the sense current I1 is greater than the magnitude of the reference current I2, the transistor 505 will become conductive before the transistor 506. As a result, the node N5 will be pulled to ground through the transistor 504 causing the inverter 520 to generate an OUT signal having a HIGH logic level indicating that the antifuse 102 is programmed. As with the antifuse reading circuit 300 shown in FIG. 3, the sensing portion of an antifuse read operation performed by the antifuse reading circuit 500 is independent of the high pulse width of the RDFZ signal. The total read time is the sum of the high pulse width of the RDFZ signal and the time for the node N5 to reach a voltage level sufficient to cause the inverter 520 to generate the OUT signal.

Figure 6:
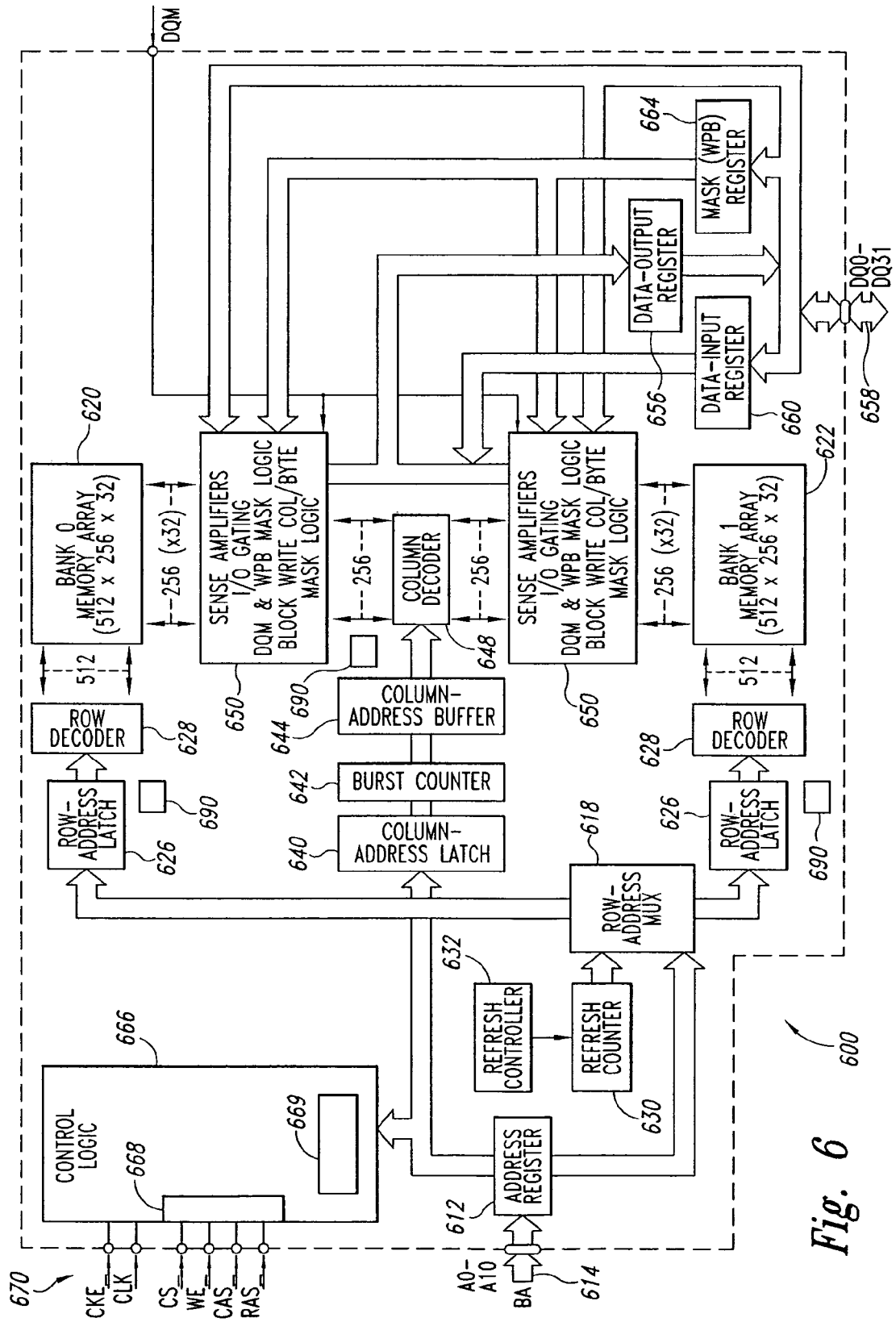
FIG. 6 is a functional block diagram of a memory device having an antifuse reading circuit according to an embodiment of the present invention.

FIG. 6 illustrates a SDRAM device 600 having at least one antifuse reading circuit according to an embodiment of the present invention. The SDRAM device 600 includes an address register 612 receiving either a row address and a bank address bit BA or a column address on an address bus 614. The address bus 614 is generally coupled to a memory controller (not shown in FIG. 6). A row address and a bank address are received by the address register 612, and applied to a row address multiplexer 618. The row address multiplexer 618 couples the row address to one of two row address latches 626 depending on the state of the bank address BA. Each of the row address latches 626 stores the row address and applies it to a row decoder 628, which applies various signals to a respective memory bank array 620, 622 as a function of the stored row address. The row address multiplexer 618 also couples row addresses to the row address latches 626 for the purpose of refreshing memory cells in the arrays 620, 622. The row addresses are generated for refresh purposes by a refresh counter 630 that is controlled by a refresh controller 632. The arrays 620, 622 are comprised of memory cells arranged in rows and columns.

After the row address has been applied to the address register 612 and stored in one of the row address latches 626, a column address is applied to the address register 612. The address register 612 couples the column address to a column address latch 640. Depending on the operating mode of the SDRAM device 600, the column address is either coupled through a burst counter 642 to a column address buffer 644, or to the burst counter 642, which applies a sequence of column addresses to the column address buffer 644 starting at the column address output by the address register 612. In either case, the column address buffer 644 applies a column address to a column decoder 648, which applies various column signals to respective sense amplifiers and associated column circuits 650, 652 for the respective arrays 620, 622.

Data to be read from one of the arrays 620, 622 are coupled from the arrays 620, 622, respectively, to a data bus 658 through the column circuit 650, 652, respectively, and a read data path that includes a data output register 656. Data to be written to one of the arrays 620, 622 are coupled from the data bus 658 through a write data path, including a data input register 660, to one of the column circuits 650, 652 where they are transferred to one of the arrays 620, 622, respectively. A mask register 664 may be used to selectively alter the flow of data into the column circuits 650, 652 by, for example, selectively masking data to be written to the arrays 620, 622.

The above-described operation of the SDRAM device 600 is controlled by a control logic circuit 666, which includes a command decode circuit 668 and a mode register 669. The control logic circuit 666 is responsive to high level command signals received from a control bus 670 through the command decode circuit 668. The high level command signals, which are typically generated by the memory controller, are a chip select signal CS_, a write enable signal WE_, a row address strobe signal RAS_, and a column address strobe signal CAS_. The memory controller also typically provides a clock enable signal CKE_ and a clock signal CLK through the control bus 670 to the control logic circuit 666. As previously mentioned, the "_" designates the signal as active low. The control logic circuit 666 generates a sequence of command signals responsive to the high level command signals to carry out a function (e.g., a read or a write) designated by each of the high level command signals. The command signals, and the manner in which they accomplish their respective functions, are conventional. Therefore, in the interest of brevity, a further explanation of the command signals will be omitted.

The SDRAM 600 includes redundant circuitry that can be employed to remap the addresses of defective memory locations found during testing to redundant memory. The redundant memory is included in the memory bank arrays 620, 622 (not shown). In particular, the redundant memory includes rows and columns of redundant memory cells. Thus, if a memory location in a row or column of a primary memory array is defective, then address corresponding to the entire column or row can be remapped to a row or column of redundant memory. By remapping the addresses of defective memory cells, the SDRAM device 600 can still be functional although it contains defective memory cells. Remapping an address to one of the rows or columns of redundant memory is accomplished in the SDRAM 600 by programming a specific combination of antifuses in one of several antifuse banks in the SDRAM device 600. The SDRAM device 600 contains several antifuse banks 690 that are located between the address latches 626, 640 and the respective decoders 628, 648. The antifuse banks 690 include antifuse reading circuits according to an embodiment of the present invention for reading the programmed or un-programmed state of the antifuses as part of the redundant memory decoding. The specific combination of antifuses are programmed corresponding to the address of a defective row or column of cells in the memory bank arrays 620, 622. For example, if the defective row or column has an 8-bit binary address of 00100100, then the appropriate antifuses in a set of 8 antifuses are programmed to store this address.

In operation, when a memory address is provided to the SDRAM device 600 for access, a compare circuit compares the incoming memory address to the addresses stored in the antifuse banks 690 to determine whether the incoming address matches any of the programmed addresses corresponding to a defective memory location. If the compare circuit determines such a match, then it outputs a match signal to a controller in a row or column decoder 628, 648, respectively. In response, the row or column decoder 628, 648 causes an appropriate row or column of redundant memory to be accessed instead of the defective row or column.

Figure 7:
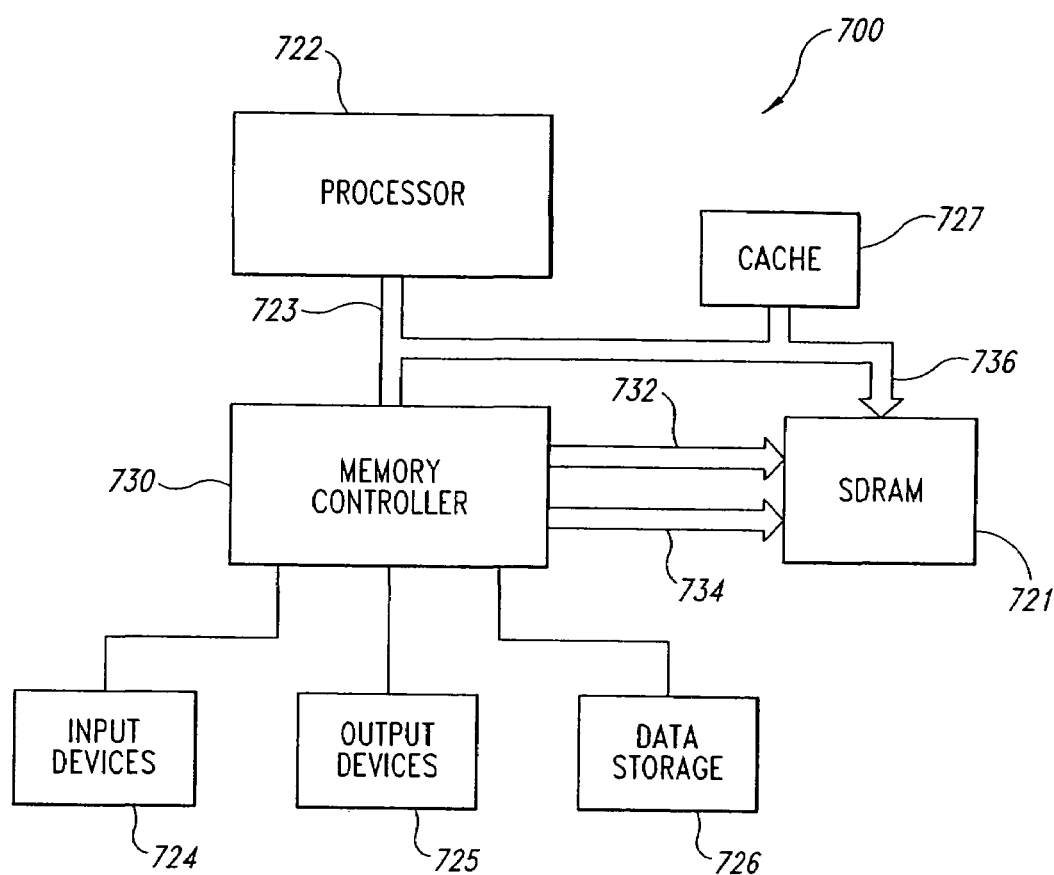
FIG. 7 is a functional block diagram of a processing system including a memory device shown in FIG. 6.

FIG. 7 is a block diagram of a computer processing system 700 including the SDRAM device 600. The computer processing system 700 includes a processor 722 for performing various computing functions, such as executing specific software to perform specific calculations or tasks. The processor 722 includes a processor bus 723 that includes an address bus, a control bus, and a data bus. The processor 722 is coupled to a cache memory 727 and to the SDRAM device 600 through a memory controller 730. The memory controller 730 includes a control bus 732 and an address bus 734 which are coupled to the SDRAM device 600. A data bus 736 is coupled between the SDRAM device 600 and the processor bus 723 for direct memory access. The computer processing system 700 further includes one or more input devices 724, such as a keyboard or a mouse, coupled to the processor 722 to allow an operator to interface with the computer processing system 700. The computer processing system 700 also includes one or more output devices 725 coupled to the processor 722, such as a printer or a video terminal. One or more data storage devices 726 may also be coupled to the processor 722 to allow the processor 722 to store data or retrieve data from internal or external storage media (not shown). Examples of typical storage devices 726 include hard and floppy disks, tape cassettes, and compact disk read-only memories (CD-ROMs).

Modifications to the memory device 600 and the computer processing system 700 can be made without departing from the scope of the present invention. Moreover, although the antifuse reading circuits have been described herein as being used for storing the addresses of defective memory locations that are remapped to redundant memory, antifuse reading circuits according to embodiments of the present invention can be used for other applications in a memory device where an antifuse is used for programming information, and there is a need to read the state of an antifuse. Moreover, antifuse reading circuits according to embodiments of the present invention can be used more generally in integrated circuits other than memory devices where antifuses are used and where there is a need to read the state of the antifuse.

From the foregoing it will be appreciated that, although specific embodiments of the invention have been described herein for purposes of illustration, various modifications may be made without deviating from the spirit and scope of the invention. For example, although the transistor 308 (FIG. 3) is shown as having its gate coupled to the VCC voltage supply, in another embodiment of the present invention a control signal is applied to the gate of the transistor 308 that can be used to vary the impedance of the transistor 308 to adjust the magnitude of the reference current I2 is desired. The adjustment of the reference current I2 can be used to compensate for voltage and temperature changes. Similarly, the transistor 508 (FIG. 5) can be used to adjust the reference current I2 where a control signal is applied to its gate, rather than being coupled to ground. Accordingly, the invention is not limited except as by the appended claims.

What is claimed is:

1. An antifuse circuit for reading an antifuse, comprising:
a first inverter having a first input node, a first output node, a first common node and a first supply node, the first common node coupled to the antifuse;
a second inverter having a second input node, a second output node, a second common node and a second supply node, the first input node coupled to the second output node and the first output node coupled to the second input node;
an impedance device coupled to the second common node and having an electrical impedance;
an initialization circuit having a supply node, an output node and a control node to which a signal is applied, the output node coupled to the first input node, the second input node and the first and second common nodes, the initialization circuit configured to couple the output node to the supply node and decouple the output node from the supply node in response to the signal applied to the control node; and an inverter having an input coupled to the second output and further having an output at which a signal having a logic level indicative of the antifuse state is provided.

2. The antifuse circuit of claim 1 wherein the initialization circuit comprises a first p-channel metal-oxide-semiconductor (PMOS) transistor coupled to the first output node, a second PMOS transistor coupled to the second output node, a third PMOS transistor coupled to the first common node and a fourth PMOS transistor coupled to the second common node, each PMOS transistor having a gate to which the pulse signal is applied.

3. The antifuse circuit of claim 1 wherein the impedance device comprises a voltage controlled impedance device having a control node and further having an electrical impedance in accordance with the voltage of a signal applied to the control node.

4. The antifuse circuit of claim 3 wherein the voltage controlled impedance device comprises an n-channel metal-oxide-semiconductor (NMOS) transistor.

5. An antifuse circuit for reading an antifuse, comprising:
a first inverter having a first input node, a first output node, a first common node and a first supply node, the first supply node coupled to the antifuse;
a second inverter having a second input node, a second output node, a second common node and a second supply node, the first input node coupled to the second output node and the first output node coupled to the second input node;
an impedance device coupled to the second supply node and having an electrical impedance;
an initialization circuit having a common node, an output node and a control node to which a signal is applied, the output node coupled to the first input node, the second input node and the first and second supply nodes, the initialization circuit configured to couple the output node to the common node and decouple the output node from the common node in response to the signal applied to the control node; and
an inverter having an input coupled to the second output and further having an output at which a signal having a logic level indicative of the antifuse state is provided.

6. The antifuse circuit of claim 5 wherein the initialization circuit comprises a first n-channel metal-oxide-semiconductor (NMOS) transistor coupled to the first output node, a second NMOS transistor coupled to the second output node, a third NMOS transistor coupled to the first common node and a fourth NMOS transistor coupled to the second common node, each NMOS transistor having a gate to which the pulse signal is applied.

7. The antifuse circuit of claim 5 wherein the impedance device comprises a voltage controlled impedance device having a control node and further having an electrical impedance in accordance with the voltage of a signal applied to the control node.

8. The antifuse circuit of claim 7 wherein the voltage controlled impedance device comprises a p-channel metal-oxide-semiconductor (PMOS) transistor.

* * * * *